(12) United States Patent
Lu

(10) Patent No.: US 11,673,796 B2
(45) Date of Patent: Jun. 13, 2023

(54) SCALABLE HIGH-VOLTAGE CONTROL CIRCUITS USING THIN FILM ELECTRONICS

(71) Applicant: PALO ALTO RESEARCH CENTER INCORPORATED, Palo Alto, CA (US)

(72) Inventor: Jengping Lu, Fremont, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 206 days.

(21) Appl. No.: 17/196,329

(22) Filed: Mar. 9, 2021

(65) Prior Publication Data

US 2022/0289561 A1    Sep. 15, 2022

(51) Int. Cl.
| | | |
|---|---|---|
| *B81B 7/00* | (2006.01) | |
| *H01L 29/40* | (2006.01) | |
| *H01L 29/786* | (2006.01) | |
| *H01L 31/0376* | (2006.01) | |
| *H01L 31/108* | (2006.01) | |

(52) U.S. Cl.
CPC ............ *B81B 7/008* (2013.01); *H01L 29/402* (2013.01); *H01L 29/78669* (2013.01); *H01L 29/78696* (2013.01); *H01L 31/03762* (2013.01); *H01L 31/108* (2013.01); *B81B 2201/03* (2013.01); *B81B 2207/03* (2013.01)

(58) Field of Classification Search
CPC . B81B 7/008; B81B 2201/03; B81B 2207/03; H01L 29/402; H01L 29/78669; H01L 29/78696; H01L 29/786; H01L 27/1214; G02B 6/12; G02B 2006/12061; G02B 2006/12145; H03K 17/78

See application file for complete search history.

(56) References Cited

U.S. PATENT DOCUMENTS

| | | | |
|---|---|---|---|
| 4,866,499 A * | 9/1989 | Aktik | ................ H01L 27/14665 257/53 |
| 5,736,732 A * | 4/1998 | Possin | ............... H01L 27/14603 257/E27.131 |
| 6,912,082 B1 | 6/2005 | Lu et al. | |
| 9,690,270 B2 | 6/2017 | Spink et al. | |
| 2009/0236496 A1* | 9/2009 | Tanada | .................. H01L 31/101 250/206 |
| 2015/0008539 A1 | 1/2015 | Kanda et al. | |
| 2016/0204293 A1* | 7/2016 | Nakai | ............... H01L 31/02008 438/66 |
| 2020/0195248 A1 | 6/2020 | Yang et al. | |

OTHER PUBLICATIONS

Extended European Search Report dated Jun. 22, 2022 in corresponding European Application No. 22157215.9, 6 pages.
Extended European Search Report dated Jun. 28, 2022 in related European Application No. 22157205.0, 7 pages.

* cited by examiner

*Primary Examiner* — Sitaramarao S Yechuri
(74) *Attorney, Agent, or Firm* — MH2 Technology Law Group LLP

(57) ABSTRACT

A device includes a first stage having a first optical switch, a first transistor connected to the first optical switch, and a second transistor connected to the first optical switch and the first transistor. The device also includes a second stage having a second optical switch, a third transistor connected to the second transistor and the second optical switch, and a fourth transistor connected to the second transistor, the second optical switch, and the third transistor.

18 Claims, 13 Drawing Sheets

SCALABLE HIGH-VOLTAGE CONTROL CIRCUITS USING THIN FILM ELECTRONICS

GOVERNMENT SUPPORT

This invention was made with U.S. Government support under Contract No. HR001119C0047 [G014.384] awarded by DARPA-SHRIMP-SRI-LEAPER. The U.S. Government has certain rights in the invention

TECHNICAL FIELD

The present teachings relate generally to microelectromechanical systems (MEMS) and, more particularly, to a high-voltage switching device for driving a MEMS actuator.

BACKGROUND

MEMS are small (e.g., microscopic) systems, particularly those with moving parts. MEMS are made up of components between 1 and 100 micrometers (μm) in size, and MEMS generally range in size from 20 micrometers to 1 millimeter (mm). MEMS usually include a central unit that processes data (e.g., a microprocessor) and several co1148mponents that interact with surroundings (e.g., microsensors). Because of the large surface area-to-volume ratio of MEMS, forces produced by ambient electromagnetism (e.g., electrostatic charges and magnetic moments), and fluid dynamics (e.g., surface tension and viscosity) are more relevant design considerations than with larger scale mechanical devices.

MEMS typically use electrostatic actuation, piezo actuation, or thermal actuation. Electrostatic actuation scales down to smaller sizes better than electromagnetic actuation and thermal actuation. However, electrostatic actuation typically relies upon higher voltage (e.g., several kV) than electromagnetic actuation and thermal actuation to generate a sufficient output. Both generating and controlling such high voltage in micro-electronics with comparable size and weight of the actuator is challenge.

SUMMARY

The following presents a simplified summary in order to provide a basic understanding of some aspects of one or more embodiments of the present teachings. This summary is not an extensive overview, nor is it intended to identify key or critical elements of the present teachings, nor to delineate the scope of the disclosure. Rather, its primary purpose is merely to present one or more concepts in simplified form as a prelude to the detailed description presented later.

A device is disclosed. The device includes a first stage having a first optical switch, a first transistor connected to the first optical switch, and a second transistor connected to the first optical switch and the first transistor. The device also includes a second stage having a second optical switch, a third transistor connected to the second transistor and the second optical switch, and a fourth transistor connected to the second transistor, the second optical switch, and the third transistor.

A switching device for driving an actuator is disclosed. The switching device includes a first stage. The first stage includes a first photodiode. The first stage also includes a first transistor having a source, a gate, and a drain. The source and the gate of the first transistor are connected to one another, and the drain of the first transistor is connected to the first photodiode. The first stage also includes a second transistor having a source, a gate, and a drain. The source of the second transistor is connected to the source and the gate of the first transistor. The gate of the second transistor is connected to the first photodiode and the drain of the first transistor. The drain of the second transistor is connected to the first photodiode. The switching device also includes a second stage. The second stage includes a second photodiode. The second stage also includes a third transistor having a source, a gate, and a drain. The source and the gate of the third transistor are connected to one another and to the drain of the second transistor, and the drain of the third transistor is connected to the second photodiode. The second stage also includes a fourth transistor having a source, a gate, and a drain. The source of the fourth transistor is connected to the drain of the second transistor and to the source and the gate of the third transistor. The gate of the fourth transistor is connected to the second photodiode and the drain of the third transistor. The drain of the fourth transistor is connected to the second photodiode.

A high-voltage switching device for driving a microelectromechanical systems (MEMS) actuator is disclosed. The switching device includes a first stage. The first stage includes a first photodiode having a semiconductor with a first terminal contact and a second terminal contact. The semiconductor includes hydrogenated amorphous silicon (a-Si:H). The first and second terminal contacts form a Schottky barrier to the semiconductor. The first stage also includes a first transistor having a source, a gate, and a drain. The source and the gate of the first transistor are connected to one another. The drain of the first transistor is connected to the first terminal contact of the first photodiode. The first transistor has a W/L ratio from about 0.1 to about 0.01. The first stage also includes a second transistor having a source, a gate, and a drain. The source of the second transistor is connected to the source and the gate of the first transistor. The gate of the second transistor is connected to the first terminal contact of the first photodiode and the drain of the first transistor. The drain of the second transistor is connected to the second terminal contact of the first photodiode. The switching device also includes a second stage. The second stage includes a second photodiode. The second stage also includes a third transistor having a source, a gate, and a drain. The source and the gate of the third transistor are connected to one another and to the drain of the second transistor. The drain of the third transistor is connected to the second photodiode. The second stage also includes a fourth transistor having a source, a gate, and a drain. The source of the fourth transistor is connected to the drain of the second transistor and to the source and the gate of the third transistor. The gate of the fourth transistor is connected to the second photodiode and the drain of the third transistor. The drain of the fourth transistor is connected to the second photodiode.

BRIEF DESCRIPTION OF THE DRAWINGS

The accompanying drawings, which are incorporated in and constitute a part of this specification, illustrate embodiments of the present teachings and together with the description, serve to explain the principles of the disclosure. In the figures.

DETAILED DESCRIPTION

Figure 1:
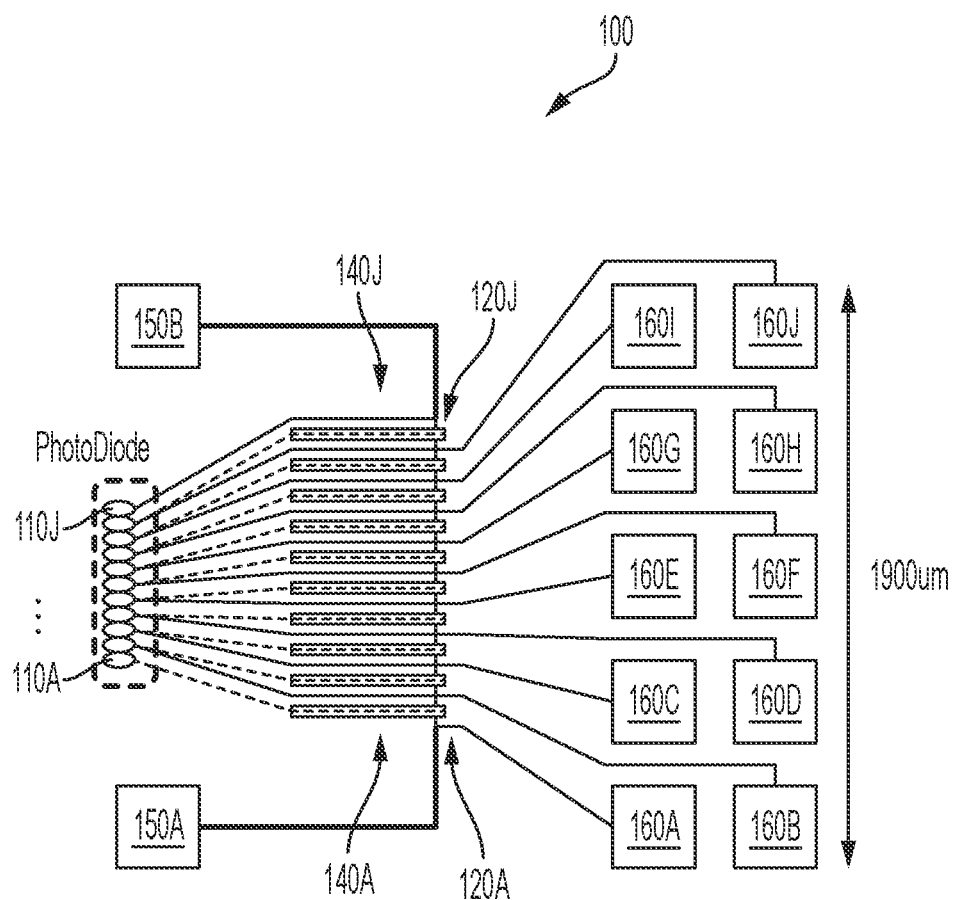
FIG. 1 depicts a schematic view of a high-voltage switching device for driving a MEMS actuator, according to an embodiment.

Reference will now be made in detail to exemplary embodiments of the present teachings, examples of which are illustrated in the accompanying drawings. Wherever possible, the same reference numbers will be used throughout the drawings to refer to the same, similar, or like parts.

The present disclosure is directed to microelectromechanical systems (MEMS). A first embodiment of the MEMS may be or include an optical coupler (also referred to as an optocoupler). The optical coupler approach simplifies the interface and isolation to a low voltage control circuit. The optical coupler approach may also cascade (e.g., stack) multiple stages to increase the voltage rating. The optical coupler approach may have a reduced energy efficiency because a light source is needed to turn the device on and off. A second embodiment of the MEMS may be or include a two-stage inverter/buffer transistor structure where the inverter thin-film transistor (TFT) and the buffer TFT are tightly integrated at sub-device level. Such tight integration helps to distribute high voltage evenly across the drain region of the buffer TFT, such that a high voltage rating can be achieved.

A hydrogenated amorphous silicon (a-Si:H) based high-voltage (HiV)-TFT, specifically the "offset-gate" TFT architecture, can provide a 200 V-500 V or a 300 V-400 V operation voltage. The offset gate TFT architecture may have an ungated, drift channel region that provides a section of semiconductor(s) to distribute the high voltage across the ungated region to prevent any run-off process due to a high electric field. The ungated region can be scaled in length to maintain the same electric field with an arbitrary voltage (e.g., E=V/L). In one example, an 800 V HiV-TFT may be built based upon this design.

However, to scale the voltage beyond 800 V, this approach becomes less and less effective. It is difficult to keep the high voltage distributed uniformly across the ungated region such that it is not locally concentrated to cause a runaway breakdown process. In addition, having a longer ungated region may have a negative impact to on-current. The ungated channel is naturally "resistive". The on current of a TFT with a long ungated channel may be small for the same channel width. Scaling up the length of the ungated channel length may cause the on/off ratio to decrease rapidly. The 800 V HiV-TFT may have an on/off ratio of about 3-4 orders of magnitude. The fundamental difficulty of a scalable high voltage driver that has a reliable way to implement a wide range of desired voltages is to prevent the high voltage focus on a small region of channel material or a device, which would cause a runaway breakdown process.

Multiple discrete transistors may be cascaded to extend the operating voltage range. However, implementing the circuitry in a TFT is challenge and has not been done before. There are several differences between using a discrete device and a TFT process. Only N-type metal-oxide-semiconductor (NMOS) active devices are available in a-Si:H TFT process. There is no P-type metal-oxide-semiconductor (PMOS) or bipolar device available. Resistors have a limited range in the a-Si:H TFT process and usually are considered an inefficient use of layout real estate. Supporting sub-circuitry to provide multiple voltage rails to control the gates of a cascaded transistor array is generally not available because they are typically complicated DC-DC converters that are beyond the capability of TFT circuits.

Figure 2:
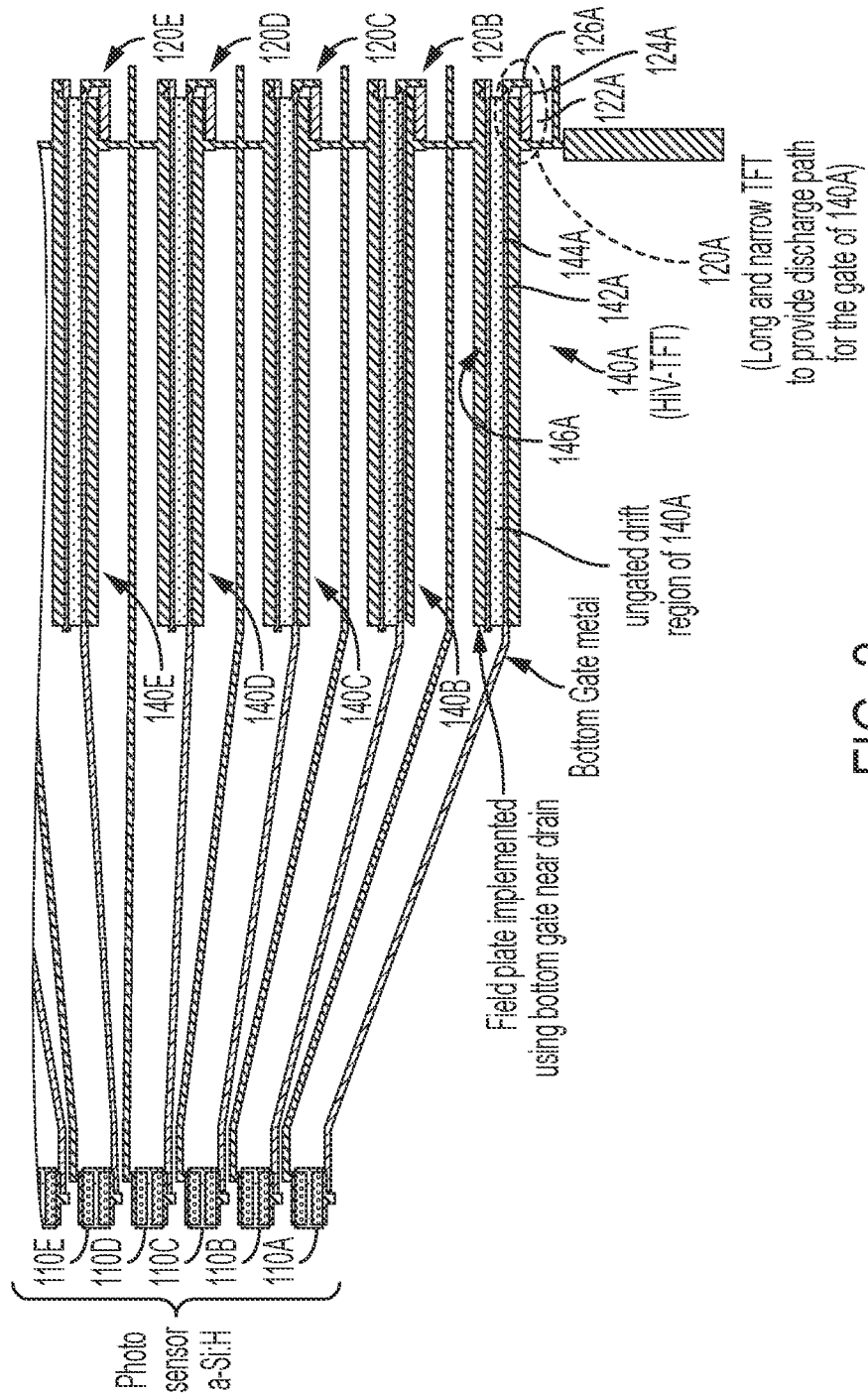
FIG. 2 depicts an enlarged view of a portion of FIG. 1, according to an embodiment.

FIG. 1 depicts a schematic view of a high-voltage switching device 100 for driving a MEMS actuator, and FIG. 2 depicts an enlarged view of a portion of FIG. 1, according to an embodiment. The device 100 may include one or more optical switches (ten are shown: 110A-110J). The optical switches 110A-110J may be or include photodiodes (e.g., semiconductor diodes) that that convert light into electrical current. In one embodiment, the semiconductors may be or include a-Si:H. The semiconductors may each include two terminal contacts. The terminal contacts may form a Schottky barrier to the semiconductor. The terminal contact material may be or include TiW, MoCr, Mo, ITO, or a combination thereof.

The device 100 may also include one or more first transistors (ten are shown: 120A-120J). The first transistors 120A-120J may be or include TFTs. The first transistors 120A, 120J may be long and narrow to provide discharge paths for gates of the second transistors (which are introduced and described below). For example, the first transistors 120A-120J may have a length from about 20 um to about 500 um, and a width from about 3 um to about 10 um.

Each of the first transistors 120A-120J may include a source 122A, a gate 124A, and a drain 124A. Each of the first transistors 120A-120J may be connected to a respective one of the optical switches 110A-110J, as described in greater detail below. For example, the first transistor 120A may be connected to the optical switch 110A, the first transistor 120B may be connected to the optical switch 110B, and so on. The first transistors 120A-120J may have a W/L ratio that is less than 1. For example, the W/L ratio may be from about 0.1 to about 0.01.

The device 100 may also include one or more second transistors (ten are shown: 140A-140J). The second transistors 140A-140J may be or include HiV-TFTs. More particularly, the second transistors 140A-140J may be configured to operate at higher voltages than the first transistors 120A-120J. For example, the first transistors 120A-120J may be rated for a voltage of from about 10 V to about 100 V (e.g., 20 V), and the second transistors 140A-140J may be rated for a voltage from about 200 V to about 1000 V (e.g., 400 V). The second transistors 140A-140J may be shorter and wider/thicker than the first transistors 120A-120J. For example, the second transistors 140A-140J may have a length from about 3 um to about 10 um, and a width from about 10 um to about 1000 um.

Each of the second transistors 140A-140J may include a source 142A, a gate 144A, and a drain 144A. Each of the second transistors 140A-140J may be connected to a respective one of the optical switches 110A-110J and to a respective one of the first transistors 120A-120J. For example, the second transistor 140A may be connected to the optical switch 110A and to the first transistor 120A, the second transistor 140B may be connected to the optical switch 110B and to the first transistor 120B, and so on. The gates 144A-144J of the second transistors 140A-140B may be controlled by the optical switches 110A-110J. For example, each of the second transistors (e.g., 140A) may be controlled using a respective one of the optical switches (e.g., 110A) and/or a respective one of the first transistors (e.g., 120A), which causes the gate (e.g., 144A) of second transistor (e.g., 140A) to be at the same potential as the source (e.g., 142A) of second transistor (e.g., 140A). This may cause the second transistor (e.g., 140A) to be in an off state when the optical switch 110A is not illuminated.

The optical switch 110A, the first transistor 120A, and the second transistor 120A may form a first stage of the device 100, the optical switch 110B, the first transistor 120B, and the second transistor 120B may form a second stage of the device 100, and so on. Thus, the device 100 may include multiple (e.g., 10) stages that are stacked and/or cascaded, which may help the device 100 to achieve a higher (e.g., 10X) operable voltage range than a single TFT can handle/withstand. For example, the optical switches 110A-110J and the second transistors 140A-140J may be cascade connected in series to extend the operational voltage range of the device 100.

The device 100 may also include one or more pads (two are shown: 150A, 150B). The pads 150A, 150B may be metal pads that are configured to be used for probing using a probe station. The first pad 150A may be connected to the first stage (e.g., to the first transistor 120A and/or the second transistor 140A). The second pad 150B may be connected to the last (e.g., tenth) stage (e.g., to the first transistor 120J and/or the second transistor 140J).

The device 100 may also include one or more pads (ten are shown: 160A-160J). The first pad 160A may be connected to the first stage (e.g., to the first transistor 120A and/or the second transistor 140A), the second pad 160B may be connected to the second stage (e.g., to the first transistor 120B and/or the second transistor 140B), and so on.

To turn on the device 100, a light source (e.g., a LED controlled by a low-voltage control circuit) illuminates the optical switches 110A-110J, which induces a photo current and biases the gate potential of the second transistors 140A-140J toward the drain voltage. This causes the second transistors 140A-140J to turn on. The first transistors 120A-120J may serve as a load for the optical switches 110A-110J. A predetermined resistance is needed to induce enough gate voltage by the photo current, which actuates the second transistors 140A-140J into the on state.

Figure 3:
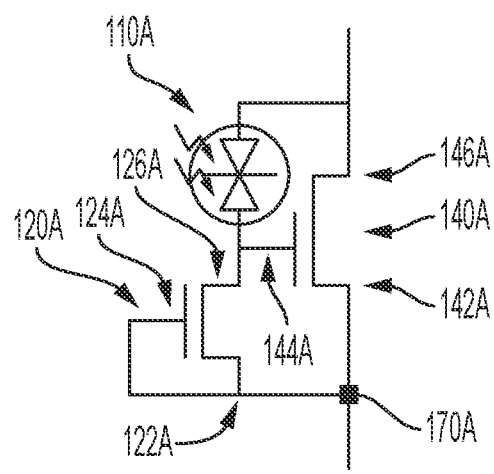
FIG. 3 depicts a circuit diagram of a first stage of the device, according to an embodiment.

FIG. 3 depicts a circuit diagram of the first stage of the device 100, according to an embodiment. As mentioned above, the first transistor 120A may include the source 122A, the gate 124A, and the drain 126A, and the second transistor 140A may include the source 142A, the gate 144A, and the drain 146A. The drain 126A of the first transistor 120A may be connected to a first side of the optical switch 110A and to the gate 144A of the second transistor 140A. The source 122A of the first transistor 120A may be connected to the gate 124A of the first transistor 120A and to the source 142A of the second transistor 140A (e.g., at the common node 170A). The drain 146A of the second transistor 140A may be connected to a second side of the optical switch 110A.

Figure 4:
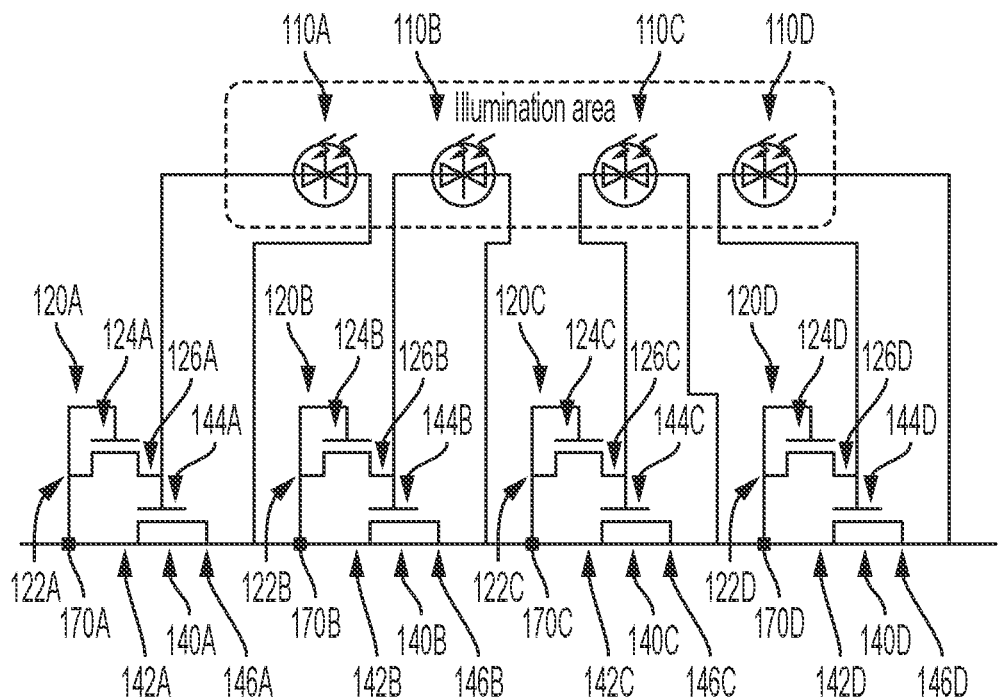
FIG. 4 depicts a circuit diagram of a plurality (e.g., 4) of the stages of the device stacked together, according to an embodiment.

FIG. 4 depicts a circuit diagram 400 of a plurality (e.g., 4) of the stages of the device 100 stacked together, according to an embodiment. As shown, the optical switch 110A and the drain 146A of the second transistor 140A of the first stage may be connected to the common node 170B of the second stage, the optical switch 110B and the 146B of the second transistor 140B of the second stage may be connected to the common node 170C of the third stage, and the optical switch 110C and the drain 146C of the second transistor 140C of the third stage may be connected to the common node 170D of the fourth stage. The optical switches 110A-110D may be positioned close together into an illumination area to ensure light utilization and illumination uniformity. The optical switches 110A-110D may be grouped together and controlled by one (or more) light source(s) that is/are actuated by low voltage electronics.

Figure 5:
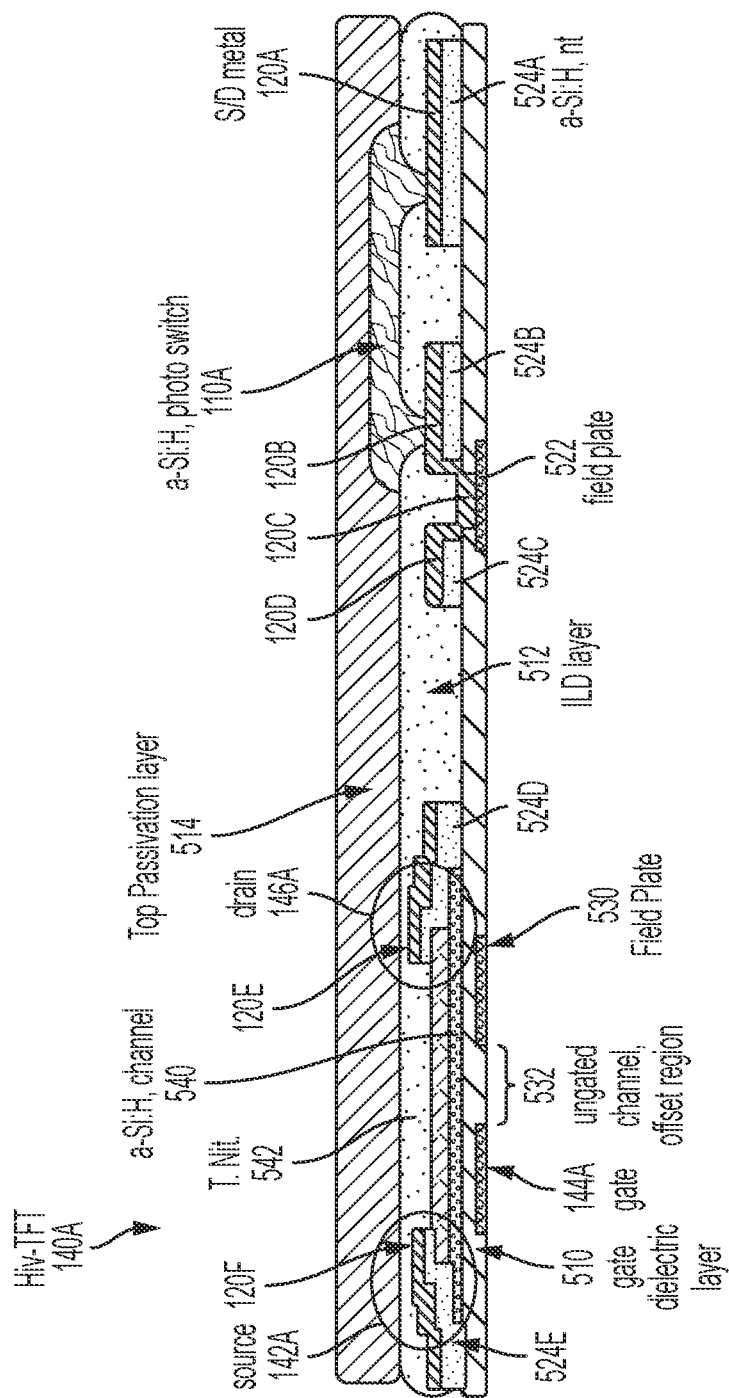
FIG. 5 depicts a schematic cross-sectional side view of a portion of the first stage of the device, according to an embodiment.

FIG. 5 depicts a schematic cross-sectional side view of a portion of the first stage of the device 100, according to an embodiment. The first stage may be formed using a back channel etch stop a-Si:H TFT process. The first stage may include a gate dielectric layer (also referred to as a bottom nitride layer) 510, an interlevel dielectric (ILD) layer 512 positioned on the gate dielectric layer 510, and a (top) passivation layer 514 positioned on the ILD layer 512.

The first stage may also include the optical switch 110A, the first transistor 120A (not shown in FIG. 5), and the second transistor 140A. The optical switch 110A may be positioned at least partially within the ILD layer 512 and/or the passivation layer 514. The optical switch 110A may be implemented on a S/D metal layer (six portions shown: 120A-120F). As shown, a first side of the optical switch 110A may be implemented on the first portion of the S/D metal layer 520A, and a second side of the optical switch 110A may be implemented on the second portion of the S/D metal layer 520B. The first and second portions of the S/D metal layer 520A, 520B may be positioned within the ILD layer 512. The first and second portions of the S/D metal layer 520A, 520B may be separated from one another (i.e., a portion of the ILD layer 512 may be positioned therebetween). The second portion of the S/D metal layer 520B may be connected to a third portion of the S/D metal layer 520C, which may be positioned at least partially within the gate dielectric layer 510. The third portion of the S/D metal layer 520C may be positioned on and/or connected to a field plate 522, which is positioned in the within the gate dielectric layer 510. The third portion of the S/D metal layer 520C may be connected to a fourth portion of the S/D metal layer 520D, which is positioned in the ILD layer 512.

An n+ doped a-Si:H layer (five portions shown: 524A-524E) may be positioned at least partially within the ILD layer 512. As shown, the first portion of the S/D metal layer 520A may be positioned at least partially on the first portion of the n+ doped a-Si:H layer 524A, the second portion of the S/D metal layer 520B may be positioned at least partially on the second portion of the n+ doped a-Si:H layer 524B, and the fourth portion of the S/D metal layer 520D may be positioned at least partially on the third portion of the n+ doped a-Si:H layer 524C.

The second transistor 140A may include the source 142A, the gate 144A, and the drain 146A. The second transistor 140A may also include a field plate 530 that is offset from the gate 144A within the gate dielectric layer 510. The field plate 530 may be positioned between the gate 144A and the drain 146A. An ungated channel (e.g., offset region) 532 may be positioned within the gate dielectric layer 510. The ungated channel 532 may be positioned between the gate 144A and the field plate 530. The ungated channel 532 may also or instead be positioned between the gate 144A and the drain 146A. The field plate 530 and/or the ungated channel region 532 may be positioned near the drain 146A to extend about 10 s of volt S/D operation range to several hundred volts operation range. This is unique to the offset-gate HiV-TFT architecture.

The second transistor 140A may also include the fifth and sixth portions of the S/D metal layer 520E, 520F. The fifth and sixth portions of the S/D metal layer 520E, 520F may be positioned within the ILD layer 512. The fifth and sixth portions of the S/D metal layer 520E, 520F may be separated from one another (i.e., a portion of the ILD layer 512 may be positioned therebetween). The fifth and sixth portions of the S/D metal layer 520E, 520F may have stepped profiles such that they each proceed closer to the passivation layer 514 as they move closer toward one another.

The second transistor 140A may also include the fourth and fifth portions of the n+ doped a-Si:H layer 524D, 524E. The fourth and fifth portions of the n+ doped a-Si:H layer 524D, 524E may be positioned within the ILD layer 512. The fourth and fifth portions of the n+ doped a-Si:H layer 524D, 524E may be separated from one another (i.e., a portion of the ILD layer 512 may be positioned therebetween). The fourth and fifth portions of the n+ doped a-Si:H layer 524D, 524E may have stepped profiles such that they each proceed closer to the passivation layer 514 as they move closer toward one another.

The second transistor 140A may also include a channel 540 (e.g., including a-Si:H) and a top nitride (T. Nit.) layer 542. The channel 540 may be positioned on the gate dielectric layer 510 and/or within the ILD layer 512. The channel 540 may be positioned at least partially between the fourth and fifth portions of the n+ doped a-Si:H layer 524D, 524E. The top nitride layer 542 may be positioned on the channel 540. The top nitride layer 542 may be positioned at least partially between the fourth and fifth portions of the n+ doped a-Si:H layer 524D, 524E. The channel 540 may have a greater width than the top nitride layer 542.

The source 142A may include at least a portion of the sixth portion of the S/D metal layer 520F, the fifth portion of the n+ doped a-Si:H layer 524E, the channel 540, and the top nitride layer 542. The drain 146A may include at least a portion of the fifth portion of the S/D metal layer 520E, the fourth portion of the n+ doped a-Si:H layer 524D, the channel 540, and the top nitride layer 542. The channel 540 and the top nitride layer 542 may be positioned at least partially between the source 142A and the drain 146.

In one embodiment, the separated a-Si:H layer 520 for optical switch 110A can be implemented in the same a-Si:H channel material. However, a process modification needs to be made to ensure the optical switch 110A has predetermined on/off ratio. This alternative implantation will be discussed later.

Figure 6:
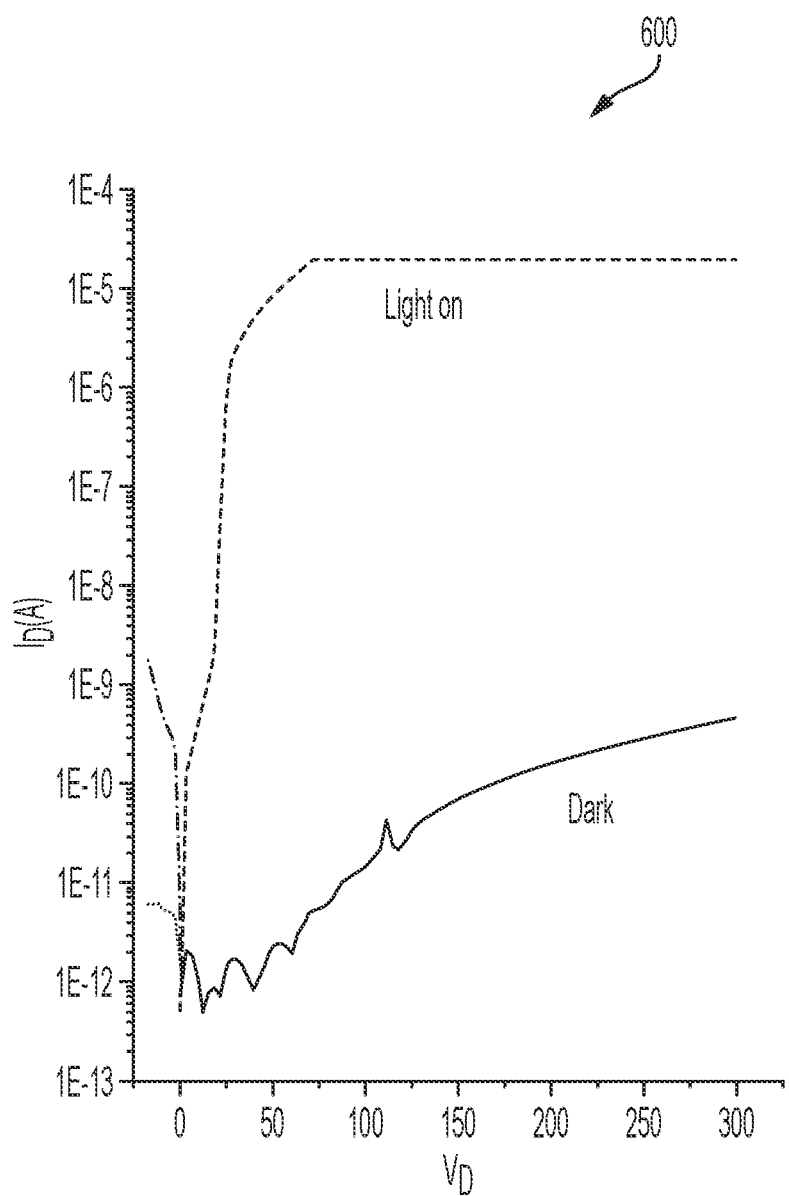
FIG. 6 depicts a graph showing the current and voltage characteristics for the first stage of the device, according to an embodiment.
Figure 7:
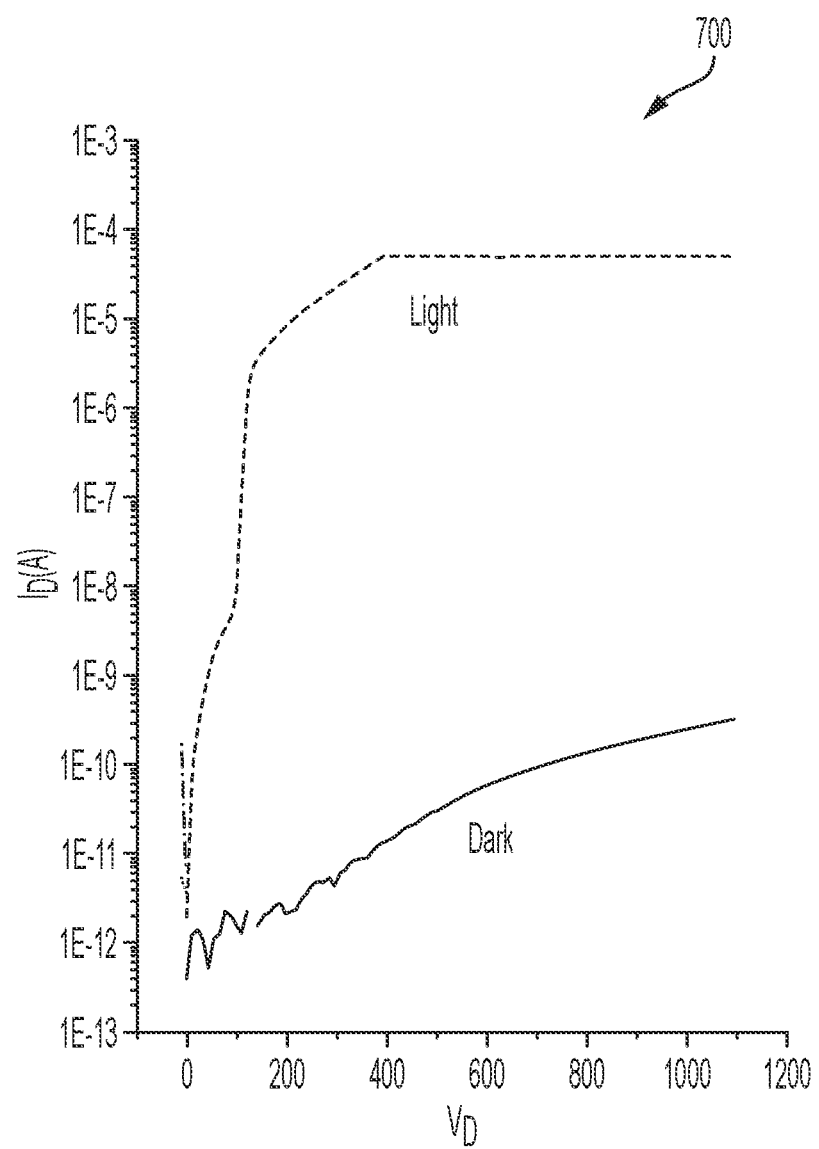
FIG. 7 depicts a graph showing the current and voltage characteristics for a plurality of stacked and/or cascaded stages (e.g., four stages) of the device, according to an embodiment.

FIG. 6 depicts a graph 600 showing the current and voltage characteristics for the first stage of the device 100, and FIG. 7 depicts a graph 700 showing the current and voltage characteristics for a plurality of stacked and/or cascaded stages (e.g., four stages) of the device 100, according to an embodiment. Both graphs 600, 700 show one curve for a first (e.g., on) state of the device 100 and another curve for a second (e.g., off) state of the device 100. As may be seen, when the device 100 has four stages, the device 100 may generate 4X the voltage when compared to when the device 100 has a single stage. For example, the single stage embodiment works up to about 300 V, and the multi-stage embodiment works up to about 1200 V. The current limit for the single stage embodiment is set to 20 μA, and the current limit for the multi-stage embodiment is set to 50 μA. More than 6 orders of magnitude of the on/off ratio is demonstrated for both the single stage embodiment and the multi-stage embodiment.

Figure 8:
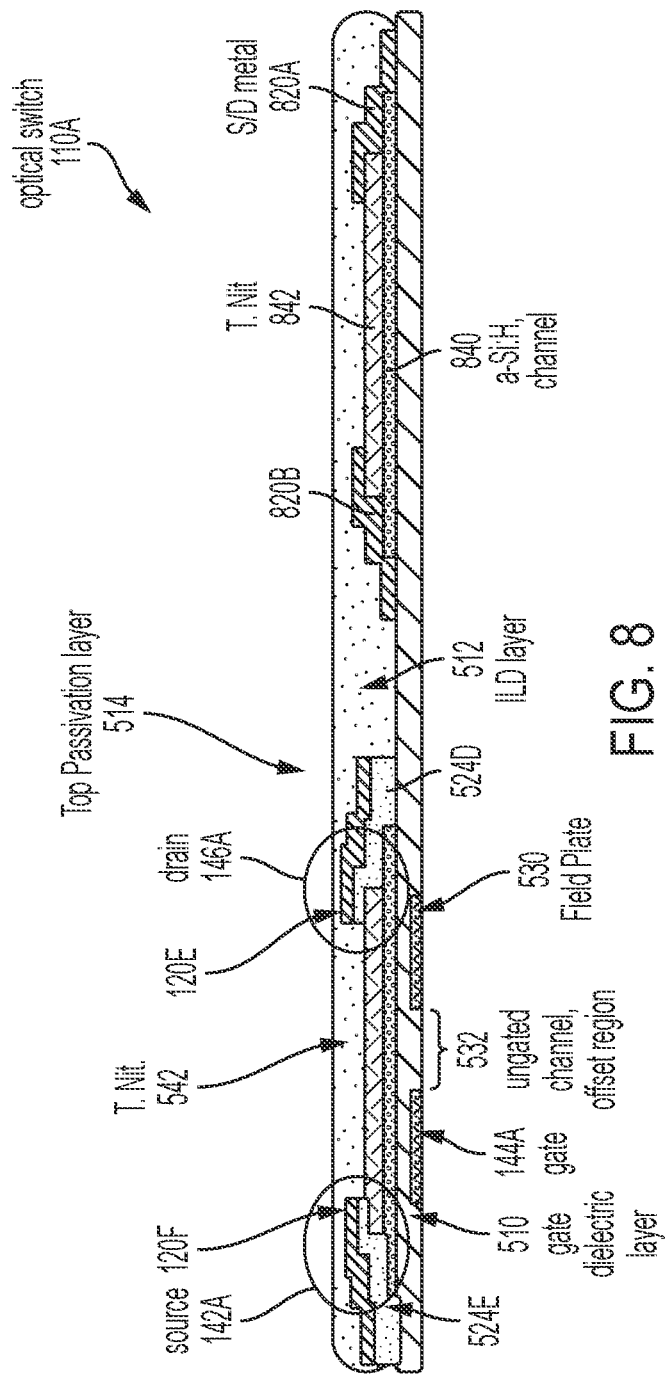
FIG. 8 depicts a schematic cross-sectional side view of a portion of the first stage of the device, according to an embodiment.

FIG. 8 depicts a schematic cross-sectional side view of a portion of the first stage of the device 100, according to an embodiment. The embodiment in FIG. 8 is an alternative to the embodiment in FIG. 5. In this embodiment, the first stage may include the gate dielectric layer 510 and the interlevel dielectric (ILD) layer 512 positioned on the gate dielectric layer 510. The (top) passivation layer 514 may optionally be omitted.

The optical switch 110A may include two portions of the S/D metal layer 820A, 820B. The portions of the S/D metal layer 820A, 820B may have stepped profiles such that they each proceed farther from the gate dielectric layer 510 as they move closer toward one another. The optical switch 110A may also include a channel 840 (e.g., including a-Si:H) and a top nitride layer 842. The channel 840 may be positioned on the gate dielectric layer 510 and/or within the ILD layer 512. The channel 840 may be positioned at least partially between the portions of the S/D metal layer 820A, 820B. The top nitride layer 842 may be positioned on the channel 840. The top nitride layer 842 may be positioned at least partially between the portions of the S/D metal layer 820A, 820B.

As mentioned above, the optical switch 110A and the second transistor 140A can share the same a-Si:H material layer, which may simplify the layer structure and process. As shown, the second transistor 140A (illustrated on the left) and the optical switch 110A (illustrated on the right) share almost identical structure, except the optical switch 110A does not include a gate because the optical switch 110A is a two-terminal device. In addition, there is no n+ doped a-Si:H layer between the S/D metal layer 820A, 820B and the channel 840. This construction may take additional steps to build in comparison to a conventional a-Si:H TFT process, which assumes the S/D metal and n+, a-Si:H are patterned at one step, sharing same mask pattern.

Figure 9:
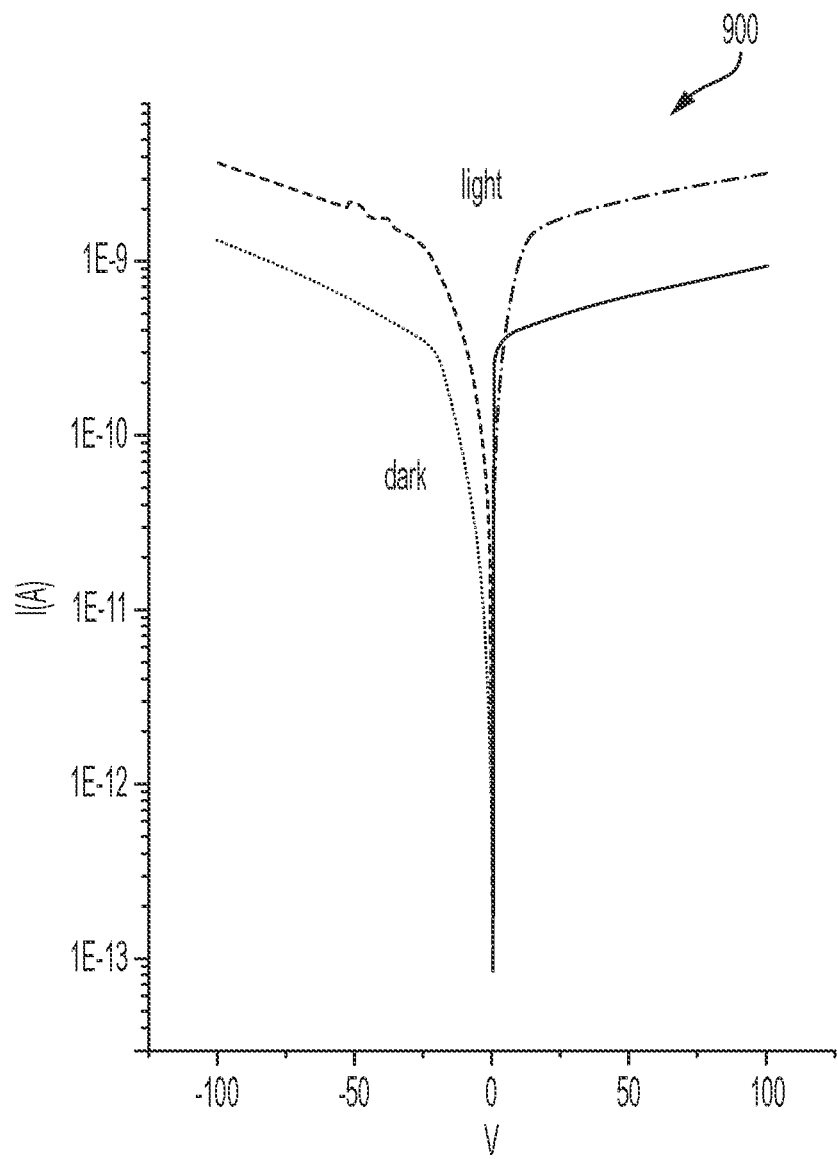
FIG. 9 depicts a graph showing the current and voltage characteristics for an optical switch of the device when the n+ doped a-Si:H layer is positioned at least partially between the S/D metal layer and the channel, according to an embodiment.
Figure 10:
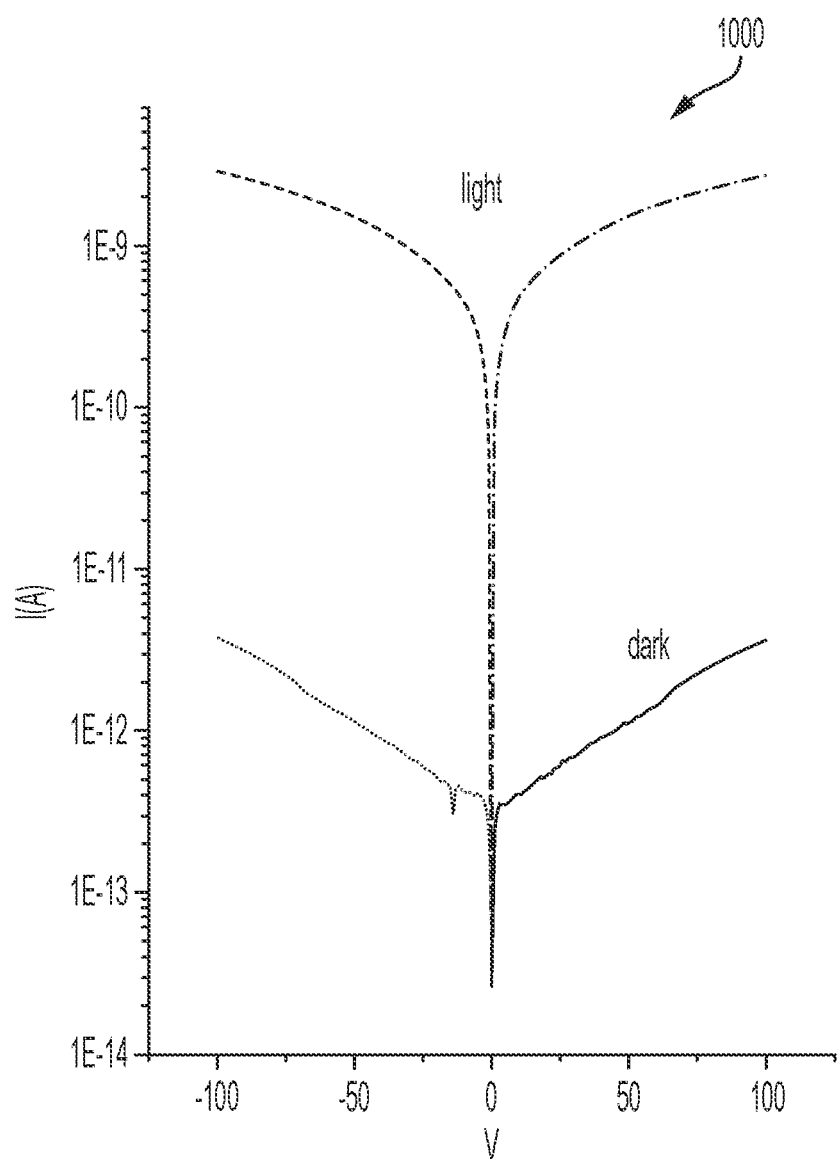
FIG. 10 depicts a graph showing the current and voltage characteristics for the optical switch when the S/D metal layer is positioned at least partially on (i.e., in direct contact with) the channel (as shown on the right side of FIG. 8), according to an embodiment.

However, FIGS. 9 and 10 show the importance of using difference contact structures separately for the optical switch 110A and the second transistor 140A.

FIG. 9 depicts a graph 900 showing the current and voltage characteristics for the optical switch 110A when the n+ doped a-Si:H layer is positioned at least partially between the S/D metal layer and the channel, according to an embodiment. More particularly, FIG. 9 shows the current and voltage characteristics of optical switch with a similar structure to the optical switch 110A shown on the right of FIG. 8, except that an n+ doped a-Si:H layer is positioned between the S/D metal layer and the channel, similar to second transistor 140A shown on the left of FIG. 8. The on/off ratio of this device is less than 10, which is poor.

FIG. 10 depicts a graph 1000 showing the current and voltage characteristics for the optical switch 110A when the S/D metal layer 820A, 820B is positioned at least partially on (i.e., in direct contact with) the channel 840 (as shown on the right side of FIG. 8), according to an embodiment. The on/off ratio is improved by more than 2 orders of magnitude to greater than 1000. Similarly, without the n+ doped a-Si:H layer for the second transistor 140A, the second transistor 140A may have a very small on current.

Figure 11:
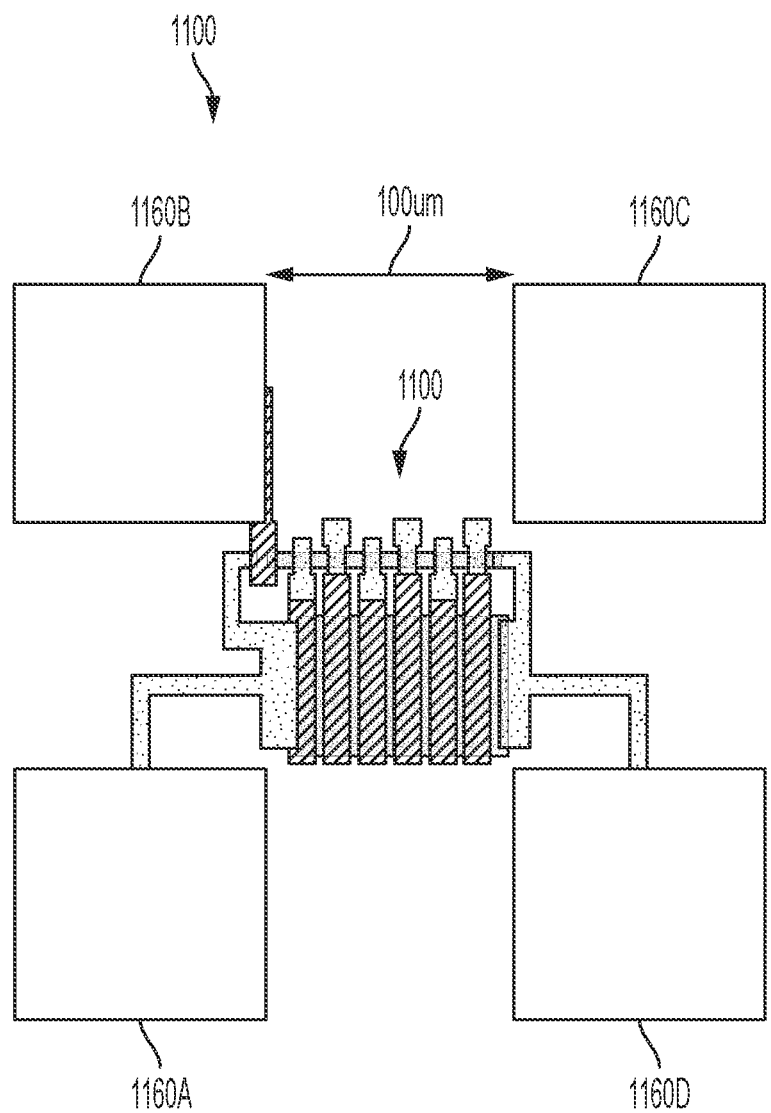
FIG. 11 depicts a schematic view of another high-voltage switching device for driving a MEMS actuator, according to an embodiment.
Figure 12:
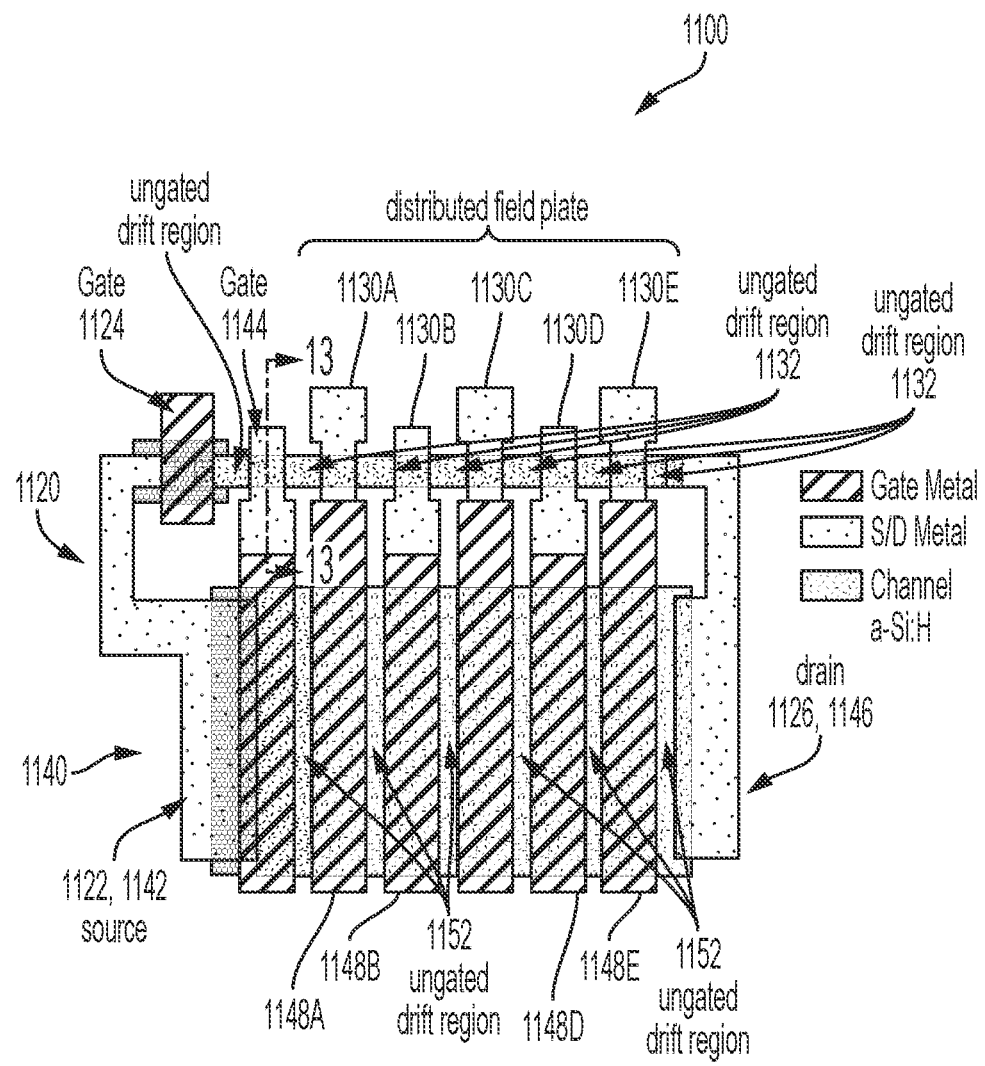
FIG. 12 depicts an enlarged portion of FIG. 11, according to an embodiment.

FIG. 11 depicts a schematic view of another high-voltage switching device 1100 for driving a MEMS actuator, and FIG. 12 depicts an enlarged portion of FIG. 11, according to an embodiment. The device 1100 may be or include an all-electrical implantation. One difference between the device 1100 shown in FIG. 11 and the device 100 described with reference to FIGS. 1-10 is that the device 1100 in FIG. 11 is straightforward scalable to the multiple KV range.

The device 1100 may be or include a composite device. The device 1100 may include one or more transistors (two are shown: 1120, 1140). The first (e.g., upper) transistor 1120 may be or include a TFT. For example, the first transistor 1120 may be or include a HiV-TFT having a source 1122, a gate 1124, and a drain 1126. The first transistor 1120 may be long and narrow. For example, the first transistor 1120 may have a length from about 20 um to about 1000 um, and a width/thickness from about 3 um to about 20 um. The first transistor 1120 may serve as an inverter (e.g., a first stage inverter). In the embodiment shown, there is no load resistor for the first transistor 1120, which differs from conventional inverter circuitry.

The device 1100 may be actuatable between a first (e.g., off) state and a second (e.g., on) state. The device 1100 may be in the off (e.g., low-current) state when the gate 1124 turns the first transistor 1120 off. The device 1100 may be in the on (e.g., higher current) state when the gate 1124 turns the first transistor 1120 on.

The second (e.g., lower) transistor 1140 may also be or include a TFT. For example, the second transistor 1140 may be or include a HiV-TFT having a source 1242, a gate 1144, and a drain 1146. The second transistor 1140 may be wider than the first transistor 1120. For example, the second transistor 1140 may have a width from about 20 um to about 1000 mm. The second transistor 1140 may serve as the drive and/or output transistor.

The sources 1122, 1142 may be connected (e.g., by metal); however, the sources 1122, 1142 may not be shared (e.g., their semiconductor channels may be separated). Similarly, the drains 1126, 1146 may be connected (e.g., by metal); however, the drains 1126, 1146 may not be shared (e.g., their semiconductor channels may be separated). The subcomponents of the transistors 1120, 1140 are closely coupled such that the device 1100 is not a conventional inverter+output transistor. Rather, the device 1100 is a composite, three-terminal device with a source, a gate, and a drain.

The first transistor 1120 may include one or more tapping electrodes (five are shown: 1130A-1130E). The electrodes 1130A-1130E may be distributed across a high voltage drifting region of an ungated channel (also referred to as an ungated drift region) 1132 of the first transistor 1120. The electrodes 1130A-1130E of the first transistor 1120 may be positioned at least partially between the gate 1124 and the drain 1126. One of the electrodes 1130A may be connected to the gate 1144 of the second transistor 1140.

The second transistor 1140 may include one or more field plates (five are shown: 1148A-1148E). The gate 1144 and field plates 1148A-1148E of the second transistor 1140 may be connected (e.g., directly) to the electrodes 1130A-1130E of the first transistor 1120. The field plates 1148A-1148E may be positioned at least partially between the gate 1144 and the drain(s) 1126, 1146. The field plates 1148A-1148E may distribute the high voltage substantially uniformly across an ungated channel (also referred to as an ungated drift region) 1152 of the second transistor 1140, which may reduce and/or prevent premature breakdown. As shown, the ungated channels 1132, 1152 may be positioned at least partially between the gate(s) 1124, 1144 and the drain(s) 1126, 1146. The operational voltage range of the device 1100 may be extended by increasing the number of the electrodes 1130A-1130E of the first transistor 1120 and/or increasing the number of field plates 1148A-1148E of the second transistor 1140.

The sources 1122, 1142, the gate 1144, the drains, 1126, 1146, the electrodes 1130A-1130E, or a combination thereof may be made of a first material (e.g., S/D metal). The gate 1124, the field plates 1148A-1148E, or a combination thereof may be made of a second material (e.g., gate metal), which is different than the first material. The channels 1132, 1152 may be made of a third material (e.g., a:Si:H), which is different from the first and second materials.

As shown in FIG. 11, the device 1100 may be connected to one or more pads (four are shown: 1160A-1160D). The pads 1160A-1160D may be metal pads that are configured to be used for probing using a probe station. As shown, the pad 1160A may be connected to the source(s) 1122, 1142, the pad 1160B may be connected to the gate 1144, and the pad 1160D may be connected to the drain(s) 1126, 1146.

The first transistor 1120 may have a modified (e.g., unconventional) structure. More particularly, in addition to the source 1122, gate 1124, and drain 1126, the first transistor 1120 may also include one or more tapped drains distributed along the ungated drift region 1132 between the gate 1124 and the drain 1126. The tapped drains may be or include the gate 1144 and/or the electrodes 1130A-1130E. The tapped drains may be configured to sample the stepped voltages of the second transistor 1140. The tapped drains may also or instead be configured to provide the field plate voltages for the second transistor 1140. In one embodiment, the tapped drains may be the field plates for the first transistor 1120. In another embodiment, the tapped drains may not be the field plates for the first transistor 1120.

In one embodiment, the electrodes 1130 may serve as field plates and/or drains for the first transistor 1120. In one embodiment, the gate 1144 may serve as a field plate and/or drain for the first transistor 1120. In one embodiment, the electrodes 1130 may serve as field plates for the second transistor 1140.

Figure 13:
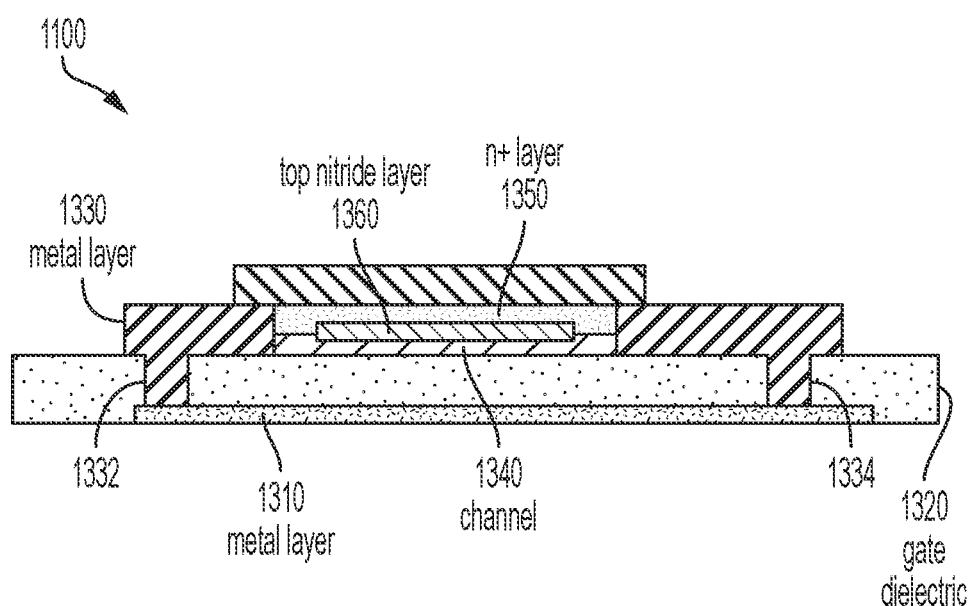
FIG. 13 depicts a schematic cross-sectional side view of a portion of the device shown in FIG. 11, according to an embodiment.

FIG. 13 depicts a schematic cross-sectional side view of a portion of the device 1100 taken through line 13-13 in FIG. 11, according to an embodiment. Although the cross-section is shown in FIG. 11 as being through the gate 1144, the cross-section may also or instead be taken through any one of the electrodes 1130A-1130E.

The device 1100 may include a first (e.g., lower) metal layer 1310. The first metal layer 1310 may be made of the same type of metal as the gate 1124. A gate dielectric layer 1120 may be positioned at least partially upon the first metal layer 1310. A second (e.g., upper) metal layer 1330 may be positioned at least partially upon the gate dielectric layer 1120. The second metal layer 1330 may be made of the same type of metal as the drain 1126. In at least one embodiment, the metal layers 1310, 1330 may be made of the same type of metal. In another embodiment, the metal layers 1310, 1330 may be made of different types of metals. The second metal layer 1330 may include one or more legs (two are shown: 1332, 1334) that extend at least partially through the gate dielectric layer 1120 toward the first metal layer 1310. In at least one embodiment, the legs 1332, 1334 are positioned upon and/or contact the first metal layer 1310.

A channel 1340 may be positioned at least partially within the second metal layer 1330. The channel 1340 may be made of a:Si:H. An n+ layer 1350 may be positioned at least partially within the second metal layer 1330. The n+ layer 1350 may be positioned at least partially on and/or above the channel 1340. The n+ layer 1350 may be or include an n+ doped a-Si:H layer. A top nitride layer 1360 may be positioned at least partially within the second metal layer 1330. The top nitride layer 1360 may be positioned at least partially between the channel 1340 and the n+ layer 1350. For example, the top nitride layer 1360 may be positioned above the channel 1340 and below the top nitride layer 1360.

A third metal layer 1370 may be positioned at least partially upon and/or above the second metal layer 1330 and/or the n+ layer 1350. The third metal layer 1370 may be made of the same type of metal as the second metal layer 1330. In at least one embodiment, the layers 1330, 1370 may be the same layer.

Figure 14:
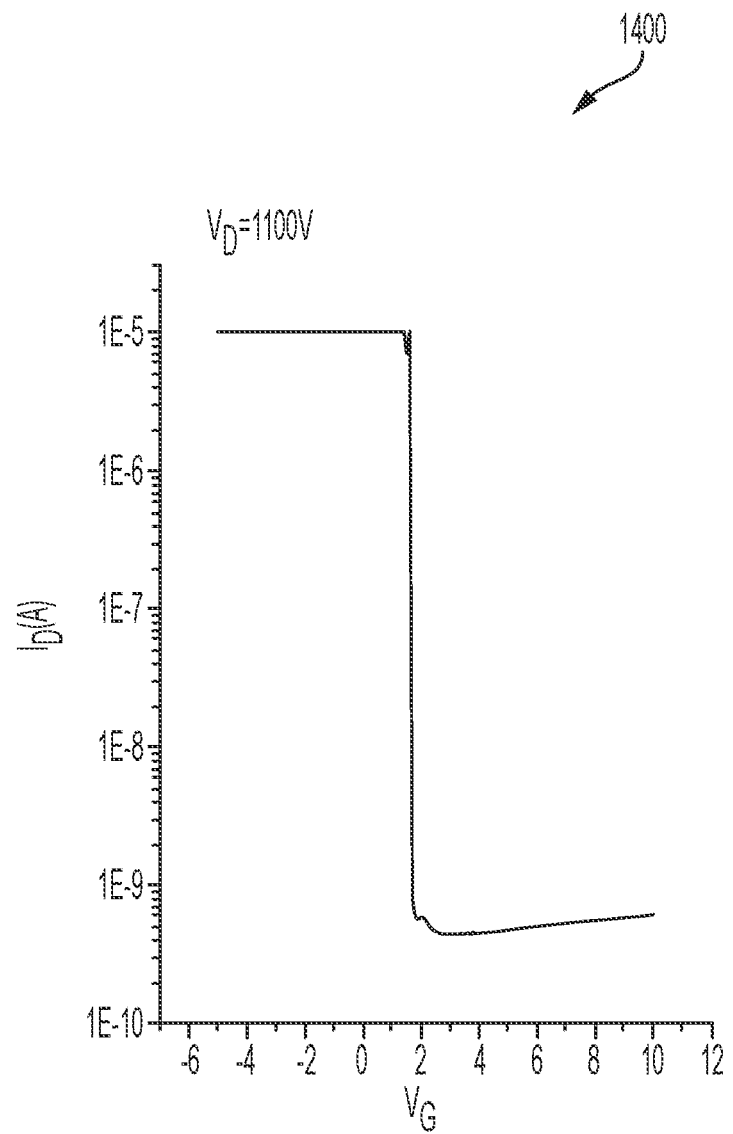
FIG. 14 depicts a graph showing the transfer characteristic of device in FIG. 11, according to an embodiment.

FIG. 14 depicts a graph 1400 showing the transfer characteristic of this device 1100, according to an embodiment. At low input gate voltage ($V_g$<2V), the device 1100 is in the "on" state, which has on current>10 uA (e.g., instrument compliance setting). For high gate input voltages ($V_g$>2.5V), the device 1100 is in the "off" state, and leakage current may be a few hundred pA at 1100 V. In one embodiment, 1100 V may be the highest voltage that the device 1100 can provide. The input voltage may be swept from −5 V to +10 V, and the S/D drain may be set to the maximum voltage range of the measurement setup (e.g., 1100 V). The current compliant is set to 10 µA. The device 1100 may achieve 4-5 orders of magnitude on/off.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" may include any and all sub-ranges between (and including) the minimum value of zero and the maximum value of 10, that is, any and all sub-ranges having a minimum value of equal to or greater than zero and a maximum value of equal to or less than 10, e.g., 1 to 5.

While the present teachings have been illustrated with respect to one or more implementations, alterations and/or modifications may be made to the illustrated examples without departing from the spirit and scope of the appended claims. For example, it may be appreciated that while the process is described as a series of acts or events, the present teachings are not limited by the ordering of such acts or events. Some acts may occur in different orders and/or concurrently with other acts or events apart from those described herein. Also, not all process stages may be required to implement a methodology in accordance with one or more aspects or embodiments of the present teachings. It may be appreciated that structural objects and/or processing stages may be added, or existing structural objects and/or processing stages may be removed or modified. Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items may be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. The terms "couple," "coupled," "connect," "connection," "connected," "in connection with," and "connecting" refer to "in direct connection with" or "in connection with via one or more intermediate elements or members." Finally, the terms "exemplary" or "illustrative" indicate the description is used as an example, rather than implying that it is an ideal. Other embodiments of the present teachings may be apparent to those skilled in the art from consideration of the specification and practice of the disclosure herein. It is intended that the specification and examples be considered as exemplary only, with a true scope and spirit of the present teachings being indicated by the following claims.

What is claimed is:

1. A device, comprising:
    a first stage comprising:
        a first optical switch;
        a first transistor connected to the first optical switch; and
        a second transistor connected to the first optical switch and the first transistor, wherein the second transistor comprises a source, a gate, and a drain, wherein the gate of the second transistor is controlled by the first optical switch, and wherein the second transistor comprises:
            a thin-film transistor (TFT) with an ungated channel region between the gate and the drain; and
            one or more field plates between the gate and the drain; and
    a second stage comprising:
        a second optical switch;
        a third transistor connected to the second transistor and the second optical switch; and
        a fourth transistor connected to the second transistor, the second optical switch, and the third transistor.

2. The device of claim 1, wherein the first optical switch comprises a semiconductor with two terminal contacts, wherein the semiconductor comprises hydrogenated amorphous silicon (a-Si:H), and wherein the terminal contacts form a Schottky barrier to the semiconductor.

3. The device of claim 1, wherein the first optical switch comprises a semiconductor with two terminal contacts, wherein the semiconductor comprises an organic material, a metal oxide, or a combination thereof.

4. The device of claim 1, wherein the first and second optical switches and the second and fourth transistors are cascade connected in series to extend an operational voltage range of the device.

5. The device of claim 1, wherein the device further comprises:
a gate dielectric layer;
an interlevel dielectric (ILD) layer positioned on the gate dielectric layer; and
wherein the second transistor comprises:
 a source;
 a gate;
 a drain;
 a first field plate, wherein the gate and the first field plate are positioned at least partially within the gate dielectric layer, and wherein the gate and the first field plate are separated by an ungated channel therebetween;
 a channel positioned at least partially within the ILD layer and between the source and the drain, wherein the channel comprises hydrogenated amorphous silicon (a-Si:H); and
 a nitride layer positioned at least partially within the ILD layer and between the source and the drain, wherein the nitride layer is positioned at least partially on the channel.

6. The device of claim 5, wherein the first optical switch comprises:
a second field plate positioned within the gate dielectric layer;
an n+ doped a-Si:H layer positioned at least partially within the ILD layer, wherein the n+ doped a-Si:H layer comprises a first portion, a second portion, and a third portion that are separated from one another; and
a metal layer positioned at least partially within the ILD layer, wherein the metal layer comprises:
 a first portion that is positioned at least partially on the first portion of the n+ doped a-Si:H layer;
 a second portion that is positioned at least partially on the second portion of the n+ doped a-Si:H layer;
 a third portion that is positioned at least partially on the third portion of the n+ doped a-Si:H layer; and
 a fourth portion that is positioned at least partially on the second field plate, at least partially between the second and third portions of the n+ doped a-Si:H layer, and at least partially between the second and third portions of the metal layer.

7. The device of claim 5, wherein the first optical switch comprises:
a metal layer positioned at least partially within the ILD layer, wherein the metal layer comprises a first portion and a second portion, wherein the first and second portions of the metal layer have stepped profiles;
a second channel positioned at least partially within the ILD layer and between the first and second portions of the metal layer, wherein the second channel comprises a-Si:H; and
a second nitride layer positioned at least partially within the ILD layer, at least partially between the first and second portions of the metal layer, and at least partially on the second channel.

8. A device, comprising:
a first stage comprising:
 a first optical switch;
 a first transistor connected to the first optical switch; and
 a second transistor connected to the first optical switch and the first transistor, wherein the first transistor is longer and narrower than the second transistor, wherein the first transistor has a W/L ratio from about 0.1 to about 0.01, and wherein the second transistor is configured to operate at a higher voltage than the first transistor; and
a second stage comprising:
 a second optical switch;
 a third transistor connected to the second transistor and the second optical switch; and
 a fourth transistor connected to the second transistor, the second optical switch, and the third transistor.

9. A switching device for driving an actuator, the switching device comprising:
a first stage comprising:
 a first photodiode;
 a first transistor comprising a source, a gate, and a drain, wherein the source and the gate of the first transistor are connected to one another, and wherein the drain of the first transistor is connected to the first photodiode; and
 a second transistor comprising a source, a gate, and a drain, wherein the source of the second transistor is connected to the source and the gate of the first transistor, wherein the gate of the second transistor is connected to the first photodiode and the drain of the first transistor, and wherein the drain of the second transistor is connected to the first photodiode; and
a second stage comprising:
 a second photodiode;
 a third transistor comprising a source, a gate, and a drain, wherein the source and the gate of the third transistor are connected to one another and to the drain of the second transistor, and wherein the drain of the third transistor is connected to the second photodiode; and
 a fourth transistor comprising a source, a gate, and a drain, wherein the source of the fourth transistor is connected to the drain of the second transistor and to the source and the gate of the third transistor, wherein the gate of the fourth transistor is connected to the second photodiode and the drain of the third transistor, and wherein the drain of the fourth transistor is connected to the second photodiode.

10. The switching device of claim 9, wherein the first transistor is longer and narrower than the second transistor, and wherein the second transistor is configured to operate at a higher voltage than the first transistor.

11. The switching device of claim 9, wherein the second transistor comprises a thin-film transistor (TFT), and wherein the gate of the second transistor is controlled by the first photodiode.

12. The switching device of claim 11, wherein the second transistor further comprises a field plate and an ungated channel region that are positioned between the gate and the drain of the second transistor, and wherein the ungated channel region is positioned between the gate and the field plate of the second transistor.

13. The switching device of claim 9, wherein the switching device is configured to actuate into an on state in response to a light source causing the first and second photodiodes to induce a photo current, which biases a gate potential of the second and fourth transistors toward a drain voltage.

14. A high-voltage switching device for driving a microelectromechanical systems (MEMS) actuator, the switching device comprising:
a first stage comprising:
a first photodiode comprising a semiconductor with a first terminal contact and a second terminal contact, wherein the semiconductor comprises hydrogenated amorphous silicon (a-Si:H), and wherein the first and second terminal contacts form a Schottky barrier to the semiconductor;
a first transistor comprising a source, a gate, and a drain, wherein the source and the gate of the first transistor are connected to one another, wherein the drain of the first transistor is connected to the first terminal contact of the first photodiode, and wherein the first transistor has a W/L ratio from about 0.1 to about 0.01; and
a second transistor comprising a source, a gate, and a drain, wherein the source of the second transistor is connected to the source and the gate of the first transistor, wherein the gate of the second transistor is connected to the first terminal contact of the first photodiode and the drain of the first transistor, and wherein the drain of the second transistor is connected to the second terminal contact of the first photodiode; and
a second stage comprising:
a second photodiode;
a third transistor comprising a source, a gate, and a drain, wherein the source and the gate of the third transistor are connected to one another and to the drain of the second transistor, and wherein the drain of the third transistor is connected to the second photodiode; and
a fourth transistor comprising a source, a gate, and a drain, wherein the source of the fourth transistor is connected to the drain of the second transistor and to the source and the gate of the third transistor, wherein the gate of the fourth transistor is connected to the second photodiode and the drain of the third transistor, and wherein the drain of the fourth transistor is connected to the second photodiode.

15. The switching device of claim 14, wherein the first transistor is longer and narrower than the second transistor, and wherein the second transistor is configured to operate at a higher voltage than the first transistor.

16. The switching device of claim 14, further comprising:
a gate dielectric layer;
an interlevel dielectric (ILD) layer positioned on the gate dielectric layer; and
wherein the second transistor comprises:
a first field plate, wherein the gate and the first field plate of the second transistor are positioned at least partially within the gate dielectric layer, and wherein the gate and the first field plate of the second transistor are separated by an ungated channel therebetween;
a channel positioned at least partially within the ILD layer and between the source and the drain of the second transistor, wherein the channel comprises hydrogenated amorphous silicon (a-Si:H); and
a nitride layer positioned at least partially within the ILD layer and between the source and the drain of the second transistor, wherein the nitride layer is positioned at least partially on the channel.

17. The switching device of claim 16, wherein the first photodiode comprises:
a second field plate positioned within the gate dielectric layer;
an n+ doped a-Si:H layer positioned at least partially within the ILD layer, wherein the n+ doped a-Si:H layer comprises a first portion, a second portion, and a third portion that are separated from one another; and
a metal layer positioned at least partially within the ILD layer, wherein the metal layer comprises:
a first portion that is positioned at least partially on the first portion of the n+ doped a-Si:H layer;
a second portion that is positioned at least partially on the second portion of the n+ doped a-Si:H layer;
a third portion that is positioned at least partially on the third portion of the n+ doped a-Si:H layer; and
a fourth portion that is positioned at least partially on the second field plate, at least partially between the second and third portions of the n+ doped a-Si:H layer, and at least partially between the second and third portions of the metal layer.

18. The switching device of claim 16, wherein the first photodiode comprises:
a metal layer positioned at least partially within the ILD layer, wherein the metal layer comprises a first portion and a second portion, wherein the first and second portions of the metal layer have stepped profiles;
a second channel positioned at least partially within the ILD layer and between the first and second portions of the metal layer, wherein the second channel comprises a-Si:H; and
a second nitride layer positioned at least partially within the ILD layer, at least partially between the first and second portions of the metal layer, and at least partially on the second channel.

* * * * *